(12) United States Patent
Stenfort

(10) Patent No.: US 9,305,620 B2
(45) Date of Patent: Apr. 5, 2016

(54) TECHNIQUES FOR REDUCING A RATE OF DATA TRANSFER TO AT LEAST A PORTION OF MEMORY

(71) Applicant: Seagate Technology LLC, Cupertino, CA (US)

(72) Inventor: Ross John Stenfort, Los Altos, CA (US)

(73) Assignee: Seagate Technology LLC, Cupertino, CA (US)

(*) Notice: Subject to any disclaimer, the term of this patent is extended or adjusted under 35 U.S.C. 154(b) by 0 days.

(21) Appl. No.: 13/966,457

(22) Filed: Aug. 14, 2013

(65) Prior Publication Data

US 2013/0332689 A1 Dec. 12, 2013

Related U.S. Application Data

(63) Continuation of application No. 12/506,068, filed on Jul. 20, 2009, now Pat. No. 8,516,166.

(51) Int. Cl.
*G06F 3/06* (2006.01)
*G11C 7/22* (2006.01)
*G11C 16/08* (2006.01)

(52) U.S. Cl.
CPC .............. *G11C 7/22* (2013.01); *G06F 3/0616* (2013.01); *G06F 3/0655* (2013.01); *G06F 3/0673* (2013.01); *G11C 16/08* (2013.01)

(58) Field of Classification Search
CPC ............... G06F 12/0246; G06F 2212/7211; G06F 2212/1036; G06F 3/0616; G06F 3/0655; G11C 16/349
See application file for complete search history.

(56) References Cited

U.S. PATENT DOCUMENTS

2006/0209684 A1 9/2006 Bei
2008/0126720 A1* 5/2008 Danilak ..................... 711/158

FOREIGN PATENT DOCUMENTS

KR 1020080090021 10/2008
WO 2011011295 1/2011

OTHER PUBLICATIONS

Tanenbaum; Structured Computer Organization; 1984; Prentice-Hall; second edition; p. 11.*
Stenfort, Ross; International Preliminary Report on Patentability for PCT/US2010/042376, filed Jul. 18, 2010, mailed Jan. 24, 2012, 4 pgs.
Stenfort, Ross; International Search Report and Written Opinion for PCT/US2010/042376, filed Jul. 18, 2010, mailed Mar. 9, 2011, 6 pgs.

* cited by examiner

*Primary Examiner* — Idriss N Alrobaye
*Assistant Examiner* — Ronald Modo
(74) *Attorney, Agent, or Firm* — Taylor English Duma LLP

(57) ABSTRACT

A system, method, and computer program product are provided for reducing a rate of data transfer to at least a portion of memory. In operation, a rate of degradation of at least a portion of memory associated with a drive is determined. Furthermore, a rate of data transfer to the at least a portion of the memory is reduced, based on the determined rate of degradation.

20 Claims, 4 Drawing Sheets

TECHNIQUES FOR REDUCING A RATE OF DATA TRANSFER TO AT LEAST A PORTION OF MEMORY

RELATED APPLICATIONS

The present application is a continuation of U.S. Non-Provisional application Ser. No. 12/506,068, filed Jul. 20, 2009, now U.S. Pat. No. 8,516,166; and wherein the foregoing application is incorporated by reference in its entirety for all purposes.

FIELD OF THE INVENTION

The present invention relates to memory systems, and more particularly to prolonging the life of memory in such systems by throttling data transfers.

BACKGROUND

Computer data storage typically refers to computer components, devices, and recording media that retain digital data used for computing. Computer data storage generally includes memory. Memory may refer to a form of semiconductor storage known as random access memory (RAM) and sometimes other forms of fast but temporary storage.

Similarly, storage systems such as hard disk drives (HDDs) include memory. Additionally, a solid-state drive (SSD) is a data storage device that uses solid-state memory to store persistent data. In some systems, an SSD may emulate a hard disk drive interface.

Memory can wear out with time. A disk drive using memory typically has a warranty period that it should not break. If the memory is wearing at such a rate that it will break before the warranty period, it may be desirable to slow the drive down such that the memory will not fail in the warranty period. There is thus a need for addressing these and/or other issues associated with the prior art.

SUMMARY

A system, method, and computer program product are provided for reducing a rate of data transfer to at least a portion of memory. In operation, a rate of degradation of at least a portion of memory associated with a drive is determined. Furthermore, a rate of data transfer to the at least a portion of the memory is reduced, based on the determined rate of degradation.

DETAILED DESCRIPTION

Figure 1:
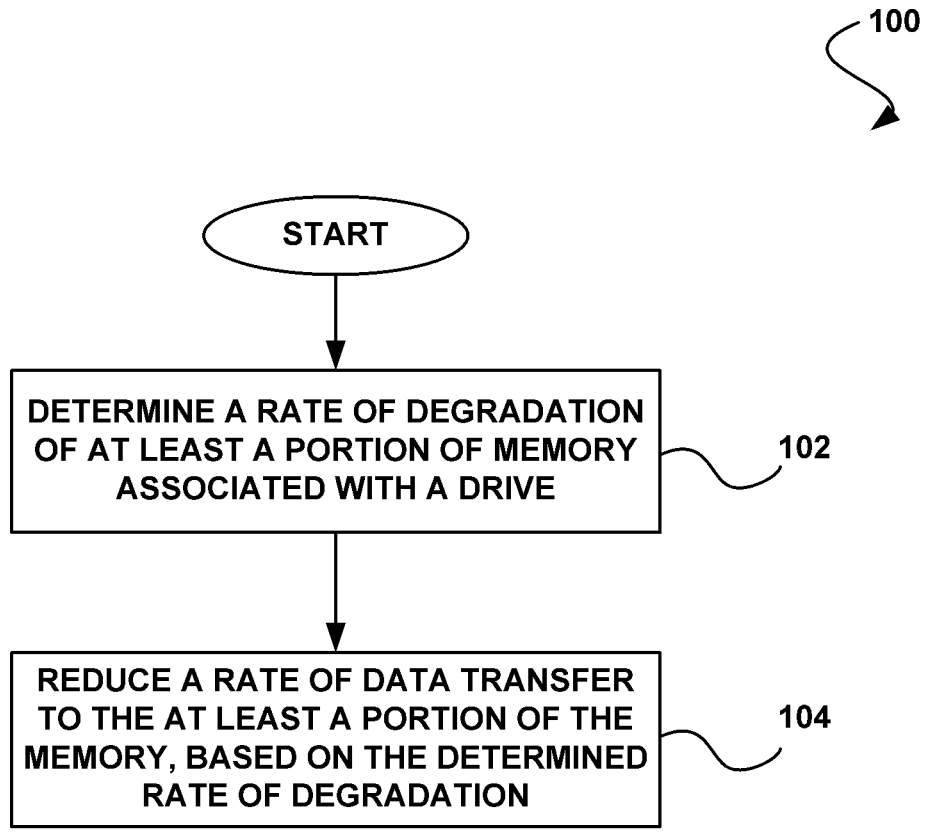
FIG. 1 shows a method for reducing a rate of data transfer to at least a portion of memory, in accordance with one embodiment.

FIG. 1 shows a method 100 for reducing a rate of data transfer to at least a portion of memory, in accordance with one embodiment. As shown, a rate of degradation of at least a portion of memory associated with a drive is determined. See operation 102.

In the context of the present description, a rate of degradation refers to an amount that memory has degraded or is degrading in an amount of time. It should be noted that the rate of degradation may be determined based on a variety of factors. Furthermore, the rate of degradation may be determined at various times.

For example, in one embodiment, the rate of degradation may be determined at power up of a system. In another embodiment, the rate of degradation may be determined in response to a command. In yet another embodiment, the rate of degradation may be determined periodically.

The drive may include any drive capable of storing data. For example, in one embodiment, the drive may include a Serial ATA (SATA) drive. In various other embodiments, the drive may include, but is not limited to, a Serial Attached SCSI (SAS) drive, a Fibre Channel (FC) drive, or a Universal Serial Bus (USB) drive, and/or any other storage device or drive.

As shown further in FIG. 1, a rate of data transfer to the at least a portion of the memory is reduced, based on the determined rate of degradation. See operation 104. In one embodiment, the rate of data transfer may include the rate of data transfer between the memory and other portions of the drive. In another embodiment, the rate of data transfer may include the rate of data transfer between a host device and the drive.

In one embodiment, reducing the rate of data transfer may include reducing a number of actions performed with respect to the memory. In this case, the actions may include writing to the memory. Additionally, the actions may include reading from the memory.

In one embodiment, an interface associated with the drive may reduce the rate of the data transfer to the memory. The interface may include any interface capable of interfacing components of the drive and the memory or interfacing a host device with the drive. For example, in various embodiments, the interface may include a SATA interface, a SAS interface, a PCI Express interface, a USB interface, etc.

The rate of data transfer to the memory may be reduced in a variety of ways. For example, in one embodiment, reducing the rate of data transfer to the memory may include inserting one or more gaps in the data. In the context of the present description, a gap refers to any break, interruption, or delay where the host device is capable of sending commands to the drive.

In various embodiments, the gap may include a time delay, or additional information, etc. For example, in one embodiment, inserting the gap may include inserting a time delay. In another embodiment, inserting the gap may include inserting additional information.

The additional information may include any type of information. For example, in one embodiment, the additional information may include information indicating a length of the gap. In another embodiment, the additional information may include vender specific information. In yet another embodiment, the additional information may include information associated with the gap.

As an option, reducing the rate of data transfer to the memory may include reducing a number of credits distributed to facilitate data transfer. For example, a credit based system may be implemented for issuing commands or transferring data. In this case, the number of credits distributed to initiate the data transfer may be reduced. In this way, the access to the memory may be reduced.

In another embodiment, reducing the rate of data transfer to the memory may include rejecting one or more connection requests between a host device and the drive. For example, a system may try to establish a connection between the drive and the memory. This connection may be blocked one or more times in order to reduce access to the memory. In one embodiment, the interface to the memory may block the connection.

As another example, a system may try to establish a connection between a host device and the drive. This connection may be blocked one or more times in order to reduce access to the memory. In one embodiment, the interface to the drive may block the connection.

In yet another embodiment, reducing the rate of data transfer to the memory may include inserting one or more align primitives in the data. For example, one or more align primitives may be inserted into the data such that the align primitives must be read and a delay is initiated.

Irrespective of the technique used to reduce the rate of data transfer, in one embodiment, the rate of data transfer may be reduced based on a mode. In this case, the mode may be a result of the determined rate of degradation. Furthermore, in various embodiments, the amount the rate of data transfer is reduced may be configurable or fixed.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
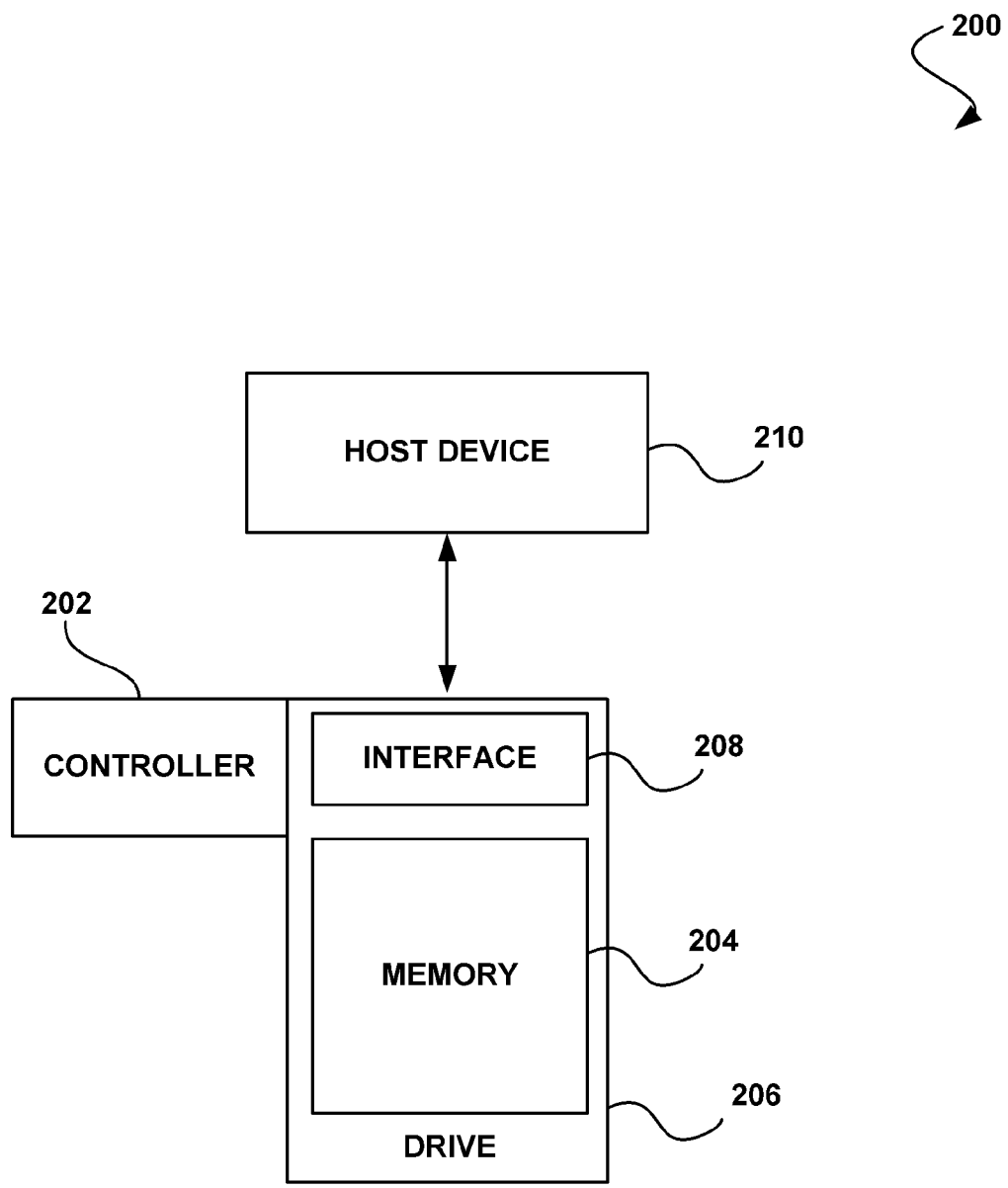
FIG. 2 shows a system for reducing a rate of data transfer to at least a portion of memory, in accordance with one embodiment.

FIG. 2 shows a system 200 for reducing a rate of data transfer to at least a portion of memory, in accordance with one embodiment. As an option, the present system 200 may be implemented to carry out the method 100 of FIG. 1. Of course, however, the system 200 may be implemented in any desired environment. It should also be noted that the aforementioned definitions may apply during the present description.

As shown, the system 200 may include a controller 202. In one embodiment, the controller 202 may be utilized for determining a rate of degradation of at least a portion of memory 204 associated with a drive 206. Of course, in various other embodiments, any number of devices may be utilized to determine the rate of degradation. Additionally, software may be utilized to determine the rate of degradation.

Furthermore, the system 200 includes an interface 208 for reducing a rate of data transfer to the at least a portion of the memory 204, based on the determined rate of degradation. In this way, memory reads and writes associated with the memory 204 may be throttled. This may help prolong the life of the memory 204.

For example, memory can wear out with time. A disk drive using memory may have a warranty period which it should not break. If the memory is wearing at such a rate that it will break before the warranty period, it may be desirable to slow the drive down such that the memory will not fail in the warranty period. Thus, the drive interface 208 may be used to slow the transfers down to reduce the number of writes and/or reads of the memory 204.

This throttling may be accomplished in a variety of ways. For example, in one embodiment, the system 200 may include a SATA drive. In this case, delays or gaps may be inserted before the drive sends a direct memory access (DMA) activate, a PIO SETUP, a data frame, or other types of information or frames.

Additionally, in one embodiment, the delays may be different for different frames types. The delays may also vary based on whether commands are being sent or received. In this case, the length of the delay may vary.

In another embodiment, the system 200 may include a SAS drive. In this case, the number of credits in a connection may be reduced. Additionally, the number of connections may be reduced.

In still another embodiment, there may be a minimum period between connections that may be reduced. Still yet, delays may be inserted between issuing transfers. Further, in the case the system 200 includes an SAS drive, the SAS connection time between the drive and the host may be limited to reduce the number of writes.

In another embodiment, the SAS connection between the drive and the host device may be closed early, without sending and/or receiving all the information that is available. In still another embodiment, the connections may be rate matched. For example, a 6G connection may be rate matched to a 3G connection such that the effective bandwidth is one half.

As another option, the transfer ready frames may be delayed, which will delay the write data being sent. In another embodiment, the throttling may be accomplished by reducing the speed of a negotiated link between the drive and the host device (e.g. from 6 to 3 Gbps, etc.).

As shown further in FIG. 2, a host device 210 may be in communication with the drive 206 through the interface 208. The host device 210 may include any device capable of sending commands to the drive 206. For example, in various embodiments, the host device 210 may include a desktop computer, a lap-top computer, and/or any other type of logic. Still yet, the host device 210 may take the form of various other devices including, but not limited to, a personal digital assistant (PDA) device, a mobile phone device, etc.

Figure 3:
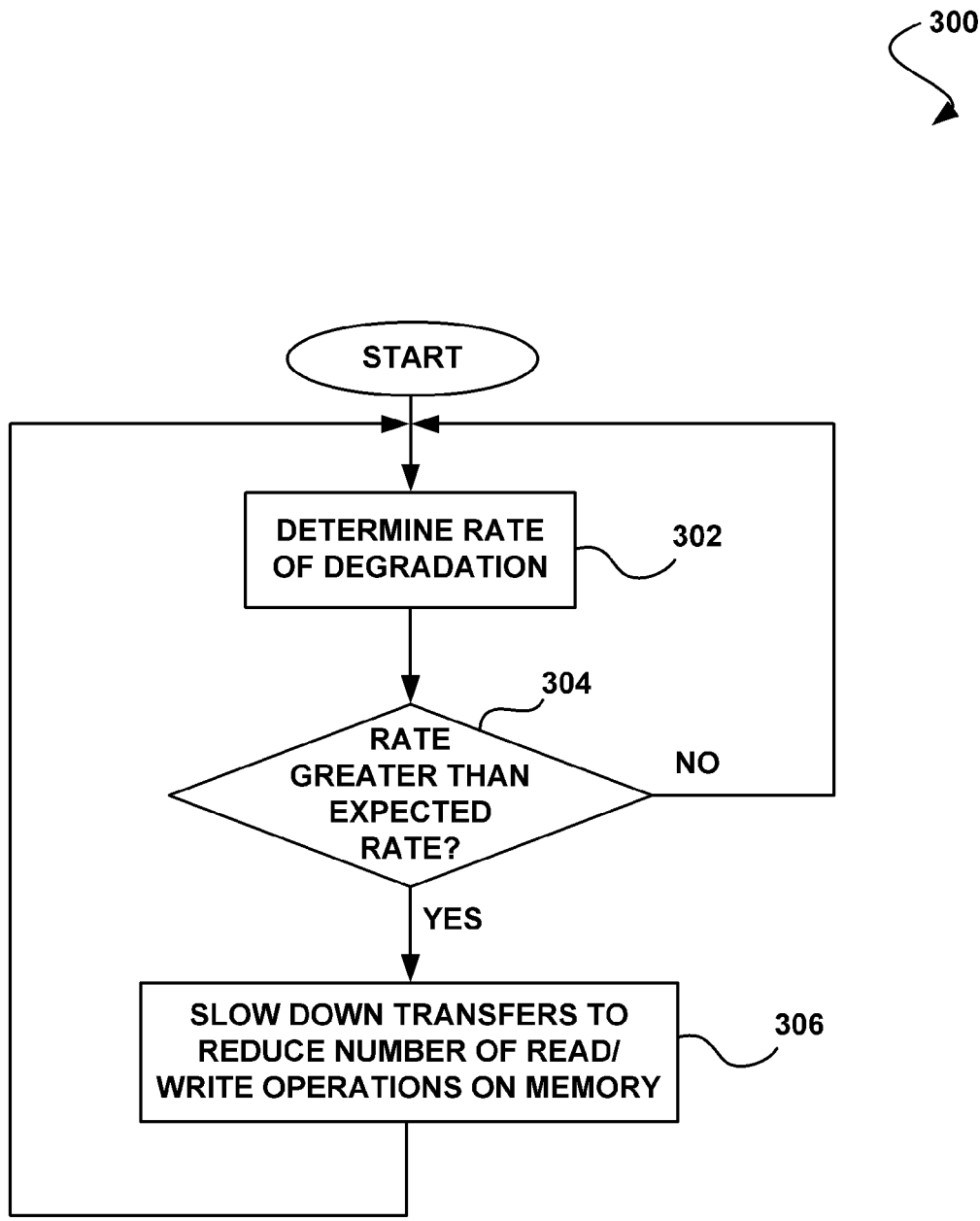
FIG. 3 shows a method for reducing a rate of data transfer to at least a portion of memory, in accordance with another embodiment.

FIG. 3 shows a method 300 for reducing a rate of data transfer to at least a portion of memory, in accordance with another embodiment. As an option, the present method 300 may be implemented in the context of the functionality and architecture of FIGS. 1-2. Of course, however, the method 300 may be carried out in any desired environment. Again, the aforementioned definitions may apply during the present description.

As shown, a rate of degradation of memory associated with a drive is determined. See operation 302. It is then determined whether the determined rate of degradation is greater than an expected rate of degradation. See operation 304.

In one embodiment, the expected rate of degradation may be an expected rate determined by a vendor or manufacturer of the memory. In this case, the expected rate may be associated with a warranty period of the memory. For example, if the memory is wearing at such a rate that it will break before the warranty period, it may desirable to slow the drive down such that the memory will not fail in the warranty period.

Thus, if it is determined that the determined rate of degradation is greater than the expected rate of degradation, the data transfers associated with the memory are slowed such that the number of read and/or write operations performed on the memory is reduced. See operation 306. In this way, the of number data transfers between a drive and a host device may be throttled such that a lifetime of the memory associated with the drive may be prolonged.

Figure 4:
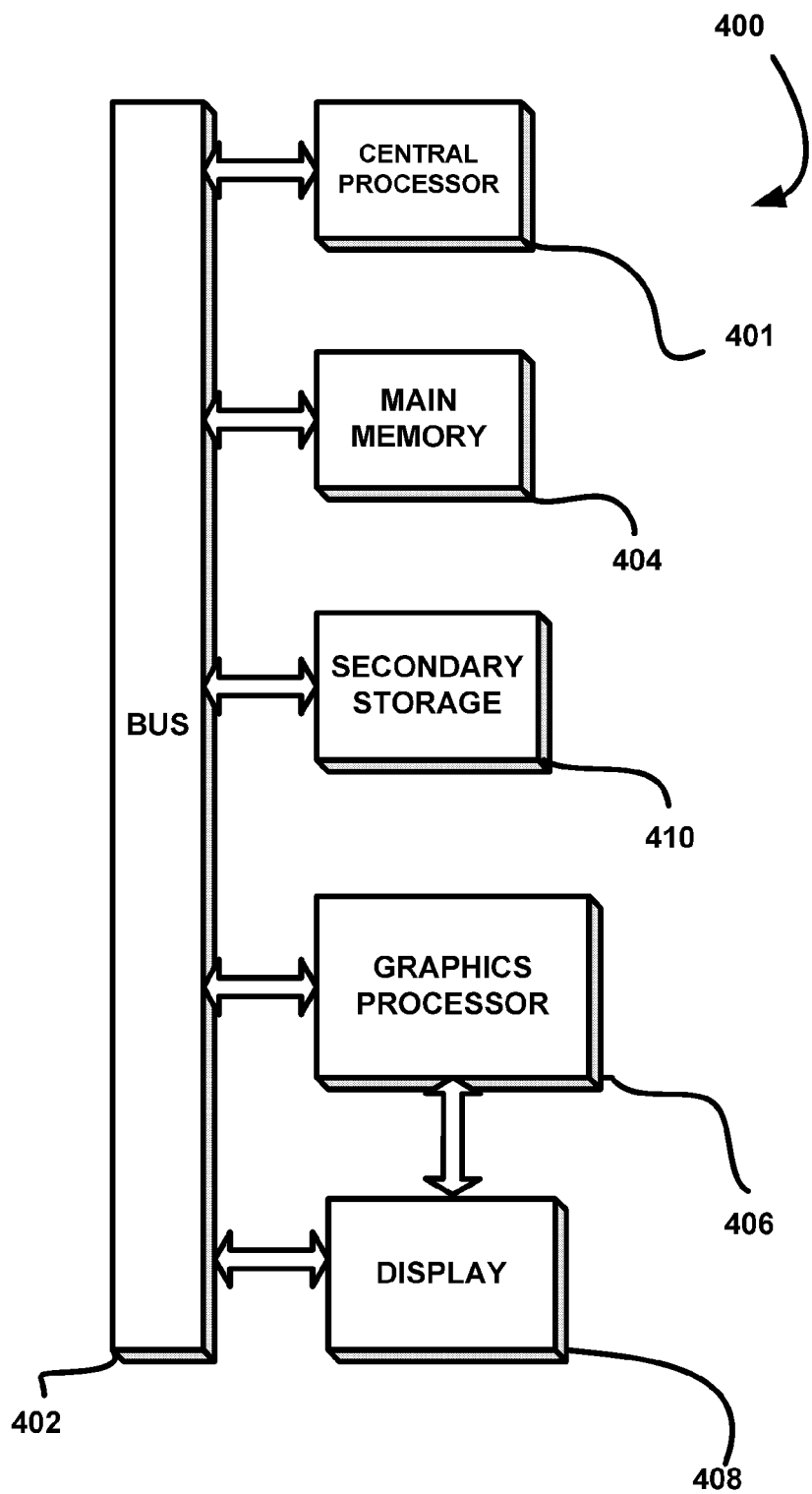
FIG. 4 illustrates an exemplary system in which the various architecture and/or functionality of the various previous embodiments may be implemented.

FIG. 4 illustrates an exemplary system 400 in which the various architecture and/or functionality of the various previous embodiments may be implemented. As shown, a system 400 is provided including at least one host processor 401 which is connected to a communication bus 402. The system 400 also includes a main memory 404. Control logic (software) and data are stored in the main memory 404 which may take the form of random access memory (RAM).

The system 400 also includes a graphics processor 406 and a display 408, i.e. a computer monitor. In one embodiment, the graphics processor 406 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 400 may also include a secondary storage 410. The secondary storage 410 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 404 and/or the secondary storage 410. Such computer programs, when executed, enable the system 400 to perform various functions. Memory 404, storage 410 and/or any other storage are possible examples of computer-readable media.

In one embodiment, the architecture and/or functionality of the various previous figures may be implemented in the context of the host processor 401, graphics processor 406, an integrated circuit (not shown) that is capable of at least a portion of the capabilities of both the host processor 401 and the graphics processor 406, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 400 may take the form of a desktop computer, lap-top computer, and/or any other type of logic. Still yet, the system 400 may take the form of various other devices including, but not limited to, a personal digital assistant (PDA) device, a mobile phone device, a television, etc.

Further, while not shown, the system 400 may be coupled to a network [e.g. a telecommunications network, local area network (LAN), wireless network, wide area network (WAN) such as the Internet, peer-to-peer network, cable network, etc.] for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   transferring data between a portion of a memory of a drive and other portions of the drive;
   repeatedly determining whether the portion of the drive memory is being degraded at greater than a predetermined rate of degradation, the rate of degradation referring to an amount that the portion of the drive memory has degraded in an amount of time; and
   repeatedly, in response to the predetermined rate being exceeded, selectively slowing down a rate of data transfer of the transferring to reduce the rate of degradation of the portion of the memory, wherein the transferring continues after the selectively slowing down, and wherein selectively slowing down the rate of degradation of the portion of the memory is based on the predetermined rate of degradation.

2. The method of claim 1, wherein selectively slowing down enables selectively reducing a number of memory accesses as required during a warranty period.

3. The method of claim 1, wherein the determining is performed at least in part utilizing software.

4. The method of claim 1, wherein the determining is performed at least in part utilizing a drive controller of the drive.

5. The method of claim 1, wherein the drive detects an excessive wear rate of the memory with respect to a warranty period and adaptively slows down actions performed with respect to the memory in an attempt to avoid drive failure during the warranty period.

6. The method of claim 1, further comprising interfacing components of the drive and the memory via an interface of the drive, wherein the selectively slowing down is performed by the interface.

7. The method of claim 1, wherein the drive comprises a predetermined one of a Serial ATA (SATA) interface, a Serial Attached SCSI (SAS) interface, a PCI Express interface, and a USB interface.

8. The method of claim 7, further comprising communicating between a host device and the drive via the interface.

9. The method of claim 1, wherein selectively slowing down is performed based on a mode.

10. The method of claim 9, wherein the mode is a result of a rate that the portion of the drive memory is being degraded.

11. The method of claim 1, wherein an amount that the rate of data transfer is reduced is configurable.

12. The method of claim 1, wherein an amount that the rate of data transfer is reduced is fixed.

13. The method of claim 1, wherein the predetermined rate of degradation is an expected rate of degradation.

14. The method of claim 1, wherein the predetermined rate of degradation is associated with a warranty period of the memory.

15. The method of claim 1, wherein selectively slowing down the rate of data transfer includes one of inserting a gap in the data, reducing a number of credits for data transfer, rejecting a connection request, and inserting an align primitive in the data.

16. A computer program product embodied on a non-transitory computer readable medium, comprising:
   computer code for transferring data between a portion of a memory of a drive and other portions of the drive;
   computer code for repeatedly determining whether portion of the memory is being degraded at greater than a predetermined rate of degradation, the rate of degradation referring to an amount that the portion of the drive memory has degraded in an amount of time; and
   computer code for repeatedly, in response to the predetermined rate being exceeded, selectively slowing down a rate of data transfer of the transferring to reduce the rate of degradation of the portion of the memory, wherein the transferring continues after the selectively slowing down, and wherein selectively slowing down the rate of degradation of the portion of the memory is based on the predetermined rate of degradation.

17. The computer program product of claim 16, wherein the selectively slowing down enables selectively reducing a number of memory accesses as required during a warranty period.

18. The computer program product of claim 16, wherein the drive is enabled to detect an excessive wear rate of the memory with respect to a warranty period and adaptively slow down actions performed with respect to the memory in an attempt to avoid drive failure during the warranty period.

19. An apparatus, comprising:
- an interface configured to transfer data between a portion of a memory of a drive and other portions of the drive; and
- a controller configured to repeatedly determine whether the portion of the memory is being degraded at greater than a predetermined rate of degradation, the rate of degradation referring to an amount that the portion of the drive memory has degraded in an amount of time,
- wherein the interface is further configured to repeatedly selectively slow down a rate of data transfer of the transferring to reduce the rate of degradation of the portion of the memory in response to the predetermined rate being exceeded, wherein the transferring continues after the selectively slowing down, and wherein selectively slowing down the rate of degradation of the portion of the memory is based on the predetermined rate of degradation.

20. The apparatus of claim 19, wherein the selectively slowing down enables selectively reducing a number of drive memory accesses as required during a warranty period.

* * * * *